US008372744B2

(12) United States Patent
Deligianni et al.

(10) Patent No.: US 8,372,744 B2
(45) Date of Patent: Feb. 12, 2013

(54) FABRICATING A CONTACT RHODIUM STRUCTURE BY ELECTROPLATING AND ELECTROPLATING COMPOSITION

(75) Inventors: Hariklia Deligianni, Tenafly, NJ (US); Xiaoyan Shao, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 803 days.

(21) Appl. No.: 11/737,926

(22) Filed: Apr. 20, 2007

(65) Prior Publication Data

US 2008/0261066 A1    Oct. 23, 2008

(51) Int. Cl.
*H01L 21/4763*    (2006.01)

(52) U.S. Cl. .......................... 438/650; 205/264

(58) Field of Classification Search ................. 438/650; 205/264, 565
See application file for complete search history.

(56) References Cited

U.S. PATENT DOCUMENTS

| | | | | |
|---|---|---|---|---|
| 3,515,651 | A | * | 6/1970 | Katsuhiro ................. 205/257 |
| 3,671,408 | A | | 6/1972 | Martini |
| 3,729,396 | A | * | 4/1973 | Browning et al. ........... 205/264 |
| 3,892,638 | A | | 7/1975 | Stevens et al. |
| 4,402,802 | A | | 9/1983 | Kreuter et al. |
| 6,241,870 | B1 | | 6/2001 | Abys et al. |
| 6,255,187 | B1 | | 7/2001 | Horrii |
| 6,261,426 | B1 | * | 7/2001 | Uzoh et al. ................ 204/224 R |
| 6,709,562 | B1 | | 3/2004 | Andricacos et al. |
| 6,900,127 | B2 | * | 5/2005 | Papa Rao et al. ............ 438/678 |
| 7,326,327 | B2 | * | 2/2008 | Armstrong et al. ............ 205/118 |
| 7,405,154 | B2 | * | 7/2008 | Cabral et al. ................ 438/630 |
| 2003/0214010 | A1 | | 11/2003 | Toyoda et al. |
| 2004/0219779 | A1 | * | 11/2004 | Basol et al. ................ 438/627 |
| 2004/0247920 | A1 | | 12/2004 | Armstrong et al. |
| 2005/0095854 | A1 | * | 5/2005 | Uzoh et al. ................ 438/678 |
| 2005/0155866 | A1 | | 7/2005 | Gabe et al. |
| 2005/0274622 | A1 | | 12/2005 | Sun et al. |
| 2005/0277283 | A1 | | 12/2005 | Lin et al. |

OTHER PUBLICATIONS

Shao et al, "An alternative low resistance MOL technology with electroplated rhodium as contact plugs for 32nm CMOS and beyond" IITC (international interconnect technology conference), 10th International Interconnect Technology Conference IEEE, pp. 102-104, 2007.

D. Edelstein, et al., "Full Copper Wiring in a Sub-0.25 μm CMOS ULSI Technology," IEEE, Intl. Electron Devices Meeting Digest, pp. 773-776, 1997.

P. C. Andricacos, et al., "Damascene copper electroplating for chip interconnections," IBM J. Res. Develop., vol. 42, No. 5, pp. 567-574, 1998.

T.P. Moffat, et al., "Superconformal Electrodeposition of Cooper," Electrochemical and Solid-State Letters 4(4), pp. C26-C29, 2001.

(Continued)

*Primary Examiner* — Matthew Landau
*Assistant Examiner* — Sun M. Kim
(74) *Attorney, Agent, or Firm* — Louis J. Percello, Esq.; Connolly Bove Lodge & Hutz LLP

(57) ABSTRACT

A contact rhodium structure is fabricated by a process that comprises obtaining a substrate having a dielectric layer thereon, wherein the dielectric layer has cavities therein into which the contact rhodium is to be deposited; depositing a seed layer in the cavities and on the dielectric layer; and depositing the rhodium by electroplating from a bath comprising a rhodium salt; an acid and a stress reducer; and then optionally annealing the structure.

35 Claims, 6 Drawing Sheets

OTHER PUBLICATIONS

T.P. Moffat, et al., "Superconformal Electrodeposition of Silver in Submicrometer Features," Journal of the Electrochemical Society, 149, pp. C423-C428, 2002.

D. Josell, et al., "Gold Superfill in Sub-Micrometer Trenches," Electrochemical and Solid-State Letters, 8(3), pp. C54-C57, 2005.

D. Pletcher, et al., "Electrodeposition of rhodium. Part 1. Chloride solutions," Journal of Electroanalytical Chemistry, 421, pp. 137-144, 1997.

D. Pletcher, et al., "Electrodeposition of rhodium. Part 2. Sulfate solutions," Journal of Electroanalytical Chemistry, 421, pp. 145-151, 1997.

R.T.S. Oliveira, et al., "Rh electrodeposition on Pt in acidic medium: a study using cyclic voltammetry and an electrochemical quartz crystal microbalance," Journal of Electroanalytical Chemistry, 569, pp. 233-240, 2004.

C.S. Peterson, et al., "Silicides of ruthenium and osmium: Thin film reactions, diffusion, nucleation, and stability," J. Appl. Phys., vol. 53, No. 7, pp. 4866-4883, 1982.

A. Topol, et al., "Lower Resistance Scaled Metal Contacts to Silicide for Advanced CMOS," VLSI conference proceeding, 2005.

European Search Report for PCT/EP2008/052866, filed on Nov. 3, 2008.

* cited by examiner

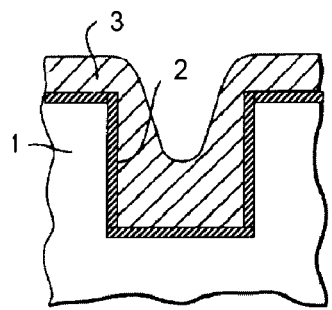 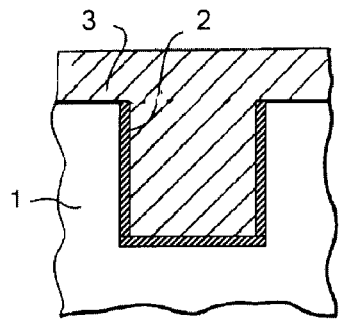 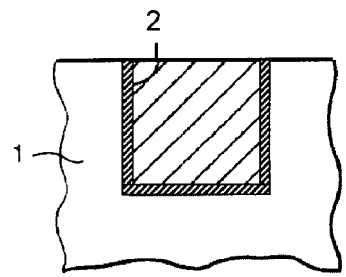
Figure 1a    Figure 1b    Figure 1c
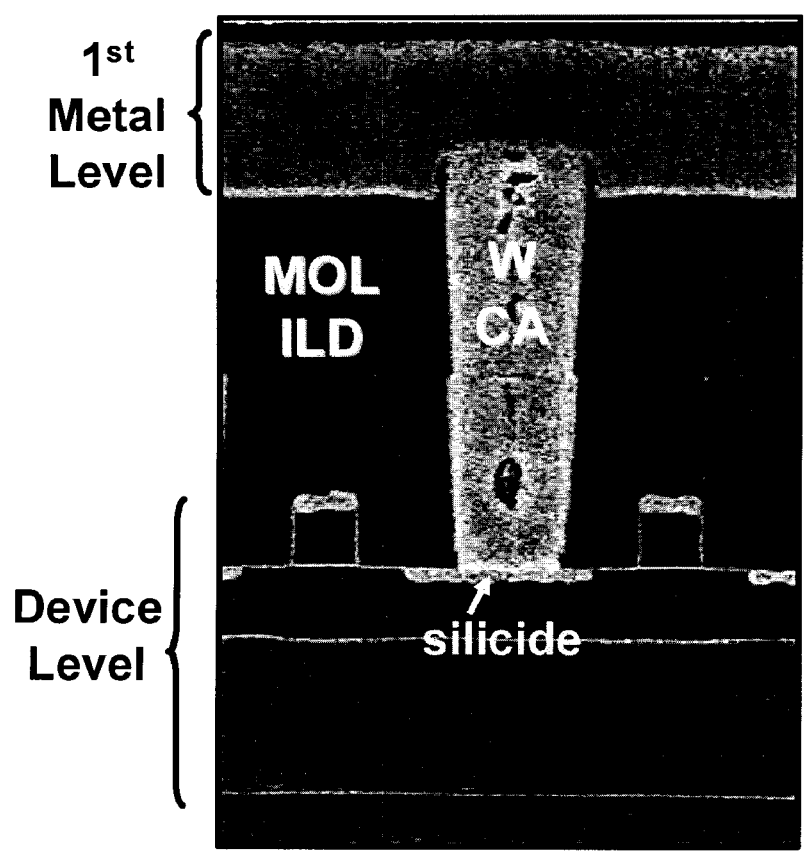
Figure 2

FABRICATING A CONTACT RHODIUM STRUCTURE BY ELECTROPLATING AND ELECTROPLATING COMPOSITION

TECHNICAL FIELD

The present disclosure relates to fabricating a contact metallurgy structure and, in particular, a rhodium structure. The present disclosure is especially significant when filling high aspect ratio submicron structures.

BACKGROUND

Conventional contact plugs are made of CVD (chemical vapor deposition) tungsten (W) for making contact to the front end devices (FEOL). The CVD (chemical vapor deposition) W process is a conformal process which tends to result in center voids and seams within the plug. Due to the shrinking contact feature sizes and the increase in contact aspect ratio, it becomes more and more challenging to fill the structure by a CVD W process and the increased parasitic resistance. Furthermore, the shrinking contact feature sizes result in a dramatic increase of parasitic resistance from the overall CVD W plug structure due to the high resistivity of CVD W and the highly resistive Ti/TiN liner stack. The poor filling of the structure by CVD W process can significantly degrade the performance of the whole chip due to the increased contact resistance with the voids and seams.

Electroplating has attracted great interest in VLSI fabrication since the discovery of copper damascene process with superfilling capability into submicron sized features. For example, see D. Edelstein, et al., *IEEE 1997 Intl. Electron Devices Meeting Digest,* 773 (1997); P. C. Andricacos, et al., *IBM J. Res. Develop.,* 42, 567 (1998) and U.S. Pat. No. 6,709,562 B1, disclosures of which are incorporated herein by reference. There have been a lot of studies to search for superfilling systems of other materials by electrodeposition. However, only Ag and Au have been reported to have some superfilling capabilities in addition to Cu. Along these lines see T. P. Moffat, et al., *Electrochem. Solid-State Lett.* 4(4), C26 (2001), T. P. Moffat, et al., *J. Electrochem. Soc.,* 149, C432 (2002) and D. Josell, et al., *Electrochem. Solid-State Lett.,* 8(3), C54 (2005).

Rhodium (Rh) is one of the platinum group metals. It is a noble and precious metal with excellent corrosion resistance. Electroplated Rh has been used for jewelry applications for its highly reflective appearance. It has been used to make electrical contacts due to its low and reliable contact resistance. Rh is also a well-known catalyst for gas conversion. See D. Pletcher, et al., *J. Electroanalytical Chem.,* 421, p 137 (1997), D. Pletcher, et al., *J. Electroanalytical Chem.,* 421, p 145 (1997) and R. T. S. Oliveira, et al., *J. Electroanalytical Chem.,* 569, p 233 (2004).

Rhodium has negligible diffusion rate in Si, (C. S. Peterson, et al., *J. Appl. Phys.,* 53(7), p 4866 (1982)) which gives great advantage over Cu as an alternative metal for CVD tungsten (W) as contact plugs in VLSI (A. Topol, et al., *VLSI conference proceeding* (2005) The resistivity of the current CVD W is reported to be approximately 20 micro-ohm-cm within the contact plugs. Filling of contact vias of 32 nm node and beyond becomes a great challenge for CVD tungsten process due to void formation during the conformal filling, as mentioned above. Also, see FIG. 2.

SUMMARY OF DISCLOSURE

The present disclosure relates to providing a rhodium contact which is, if not entirely, at least substantially void-free and/or seamless.

In particular, an aspect of the present disclosure relates to a process for fabricating a contact rhodium is substantially free of internal seams or voids.

The process of the present disclosure comprises:

obtaining a substrate having a dielectric layer thereon, wherein the dielectric layer has cavities therein into which the contact rhodium is to be deposited;

depositing a seed layer in the cavities and on the dielectric layer; and depositing the rhodium by electroplating from a bath comprising a rhodium salt; an acid and a stress reducer; and then optionally annealing the structure.

The present disclosure also relates to structures obtained by the above disclosed process.

The present disclosure also relates to contact rhodium structures comprising a substrate having a dielectric layer thereon, wherein the dielectric layer has cavities therein, and wherein cavities are filled with electroplated rhodium that is substantially free of internal seams or voids.

Still other objects and advantages of the present disclosure will become readily apparent by those skilled in the art from the following detailed description, wherein it is shown and described only in the preferred embodiments, simply by way of illustration of the best mode. As will be realized, the disclosure is capable of other and different embodiments, and its several details are capable of modifications in various obvious respects, without departing from the spirit of the disclosure. Accordingly, the description is to be regarded as illustrative in nature and not as restricted

BRIEF DESCRIPTION OF FIGURES

FIGS. 1A-1C illustrate vias filled with electroplated rhodium according to this disclosure.

FIG. 2 is a SEM cross section of vias filled with CVD tungsten contact according to prior art method.

DESCRIPTION OF BEST AND VARIOUS MODES

Figure 3:
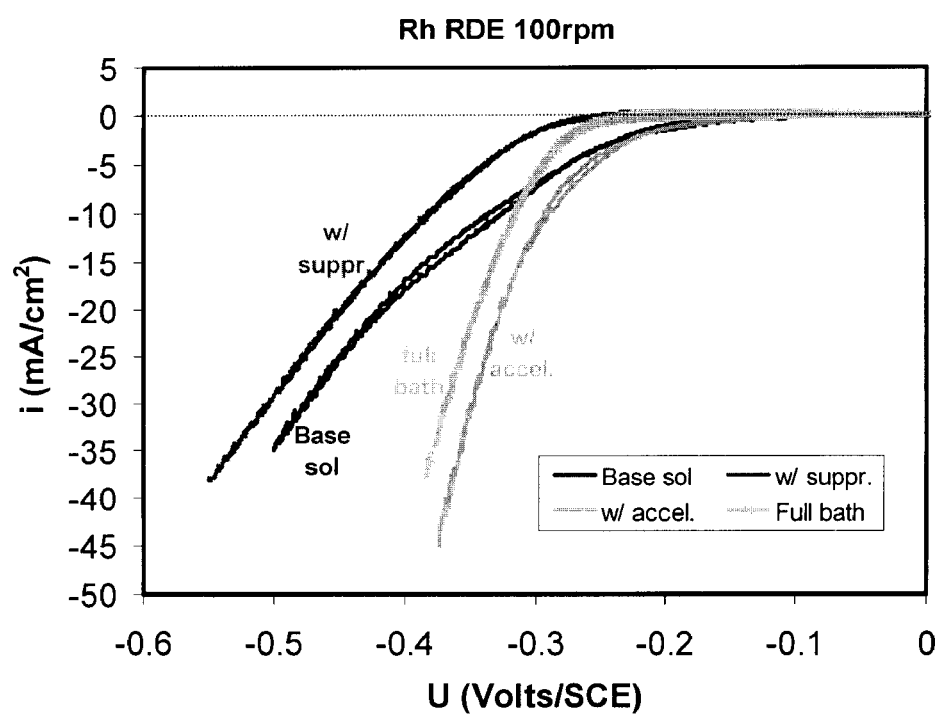
FIG. 3 illustrates i-v curves of different rhodium plating baths.

In order to facilitate an understanding of the present disclosure, reference is made to FIGS. 1A-1C which schematically illustrate a structure in various stages according to one process sequence of this disclosure.

FIG. 1A shows an insulator or dielectric 1 that is provided on a semiconductor substrate (not shown). Non-limiting examples of semiconductor substrates are silicon, silicon carbide, germanium, Group III-V semiconductor such as GaAs and GaSb.

Examples of the dielectric layer 1 are silicon dioxide ($SiO_2$), phosphosilicate glass (PSG), boron doped PSG (BDPSG) or tetraethylorthosilicate (TEOS), and more typically low-k dielectrics having a dielectric constant of less than 3.9 such as SILK (available from Dow Chemical), SiCH (available from AMAT under the trade designation BLOK), SiCOH (available from Novellus under the trade designation Coral, from AMAT under the trade designation Black Diamond and from ASM under the trade designation Auora), SiCHN (available from IBM under the trade designation N Blok), CVD carbon-doped oxide, porous CVD carbon-doped oxide, porous and non-porous organo silicates, porous and non-porous organic spin-on polymers.

An adhesion layer (not shown) can optionally be deposited on the bottom and/or side walls of the vias located in the dielectric layer 1 and on the top surface of the dielectric layer 1.

Typical adhesion layers are titanium, tantalum and their nitrides. If desired, multiple layers of different adhesion layers can be used. When employed, the adhesion layer is typically about 20 angstroms to about 200 angstroms and more typically about 20 angstroms to about 60 angstroms. The adhesion layer can be deposited by CVD (chemical vapor deposition), ALD (atomic layer deposition), or sputtering such as physical vapor deposition (PVD) or ionized physical vapor deposition (IPVD). One example of depositing is employing an HCM (Hollow Cathode Magnetron) magnetron sputter system, such as available from Applied Materials under the trade designation "Endura".

Located on the surfaces of the adhesion layer, when present, or the side walls of the via and on the top surfaces of the dielectric is an electrically conductive seed layer 2. Typical seed layers are ruthenium, platinum, copper, tungsten, cobalt, sulfide and silicon. The seed layer 2 can be deposited by known techniques. A particular example being ALD or CVD ruthenium. The seed layer is typically about 0.006 μm to about 0.25 μm thick.

Next the rhodium film is deposited by electroplating according to the present disclosure to fill the cavities (e.g. vias or bars). See FIGS. 1a and 1b. The present invention is especially advantageous when filling high aspect ratio vias or bars. The aspect ratio is typically at between about 2 about 10 and more typically about between 4 and about 10.

The vias or bars have a critical dimension (CD) of typically about 30 nm to about 250 nm, and more typically about 40 nm to about 100 nm. The present disclosure is especially advantageous for filling submicron vias and bars including having a CD dimension down to about 40 nanometers.

In order to achieve void free and seamless conductor, the rhodium is electroplated using a composition containing a rhodium salt, an acid and a stress reducer. The rhodium salt is typically rhodium sulfate, rhodium phosphate or rhodium chloride and more typically rhodium sulfate. The amount of rhodium salt in the bath is typically about 1 to about 100 grams/liter and more typically about 1 to about 10 grams/liters with a specific example being 5 grams/liter.

The bath also includes an acid such as sulfuric acid, hydrochloric acid and phosphoric acid and typically in amounts to provide a pH of about 0.1 to about 3 and more typically a pH of about 0.5 to about 1.

The stress reducer is typically present in an amount sufficient to provide a void free and/or seamless conductor at the electroplating conditions. Mixtures of different stress reduces can be employed, when desired.

An example of a stress reducing agent is a halide as disclosed in US Patent Publication 2004/247920, entire disclosure of which is incorporated herein by reference, such as a chloride and, in particular, Groups I and II chlorides, $AlCl_3$ and $CrCl_3$. When employed such are typically present in amounts of about 20 ppm to about 5000 ppm in the electroplating bath.

Another example of a stress reducer that can be employed is a rhodium sulfate based solution as disclosed in U.S. Pat. No. 6,241,870 to Abys et al., entire disclosure of which is incorporated herein by reference, which employs a complex of rhodium sulfate molecules with a minimum of metal to metal bonding and with the complex forming predominantly via bridged bidentate sufphato groups.

Another group of stress reducers are sulfonic acids such as aromatic sulfonic acids, an example being phenolsulfonic acid as disclosed in U.S. Pat. No. 4,402,802 to Kreuter, entire disclosure of which is incorporated herein by reference. When employed, such is usually present in amounts of about 0.1 to about 5 grams/liters.

Another stress reducer is sulfamic acid as disclosed in U.S. Pat. Nos. 3,671,408 and 3,892,638, entire disclosures of which are incorporated herein by reference. When employed, such is typically present in amounts of about 30 grams/liters to about 100 grams/liters.

Another stress reducer is disclosed in U.S. Pat. No. 3,729,396 to Browning et al, entire disclosure of which is incorporated herein by reference, which is a combination of an aluminum ion, provided by for example aluminum phosphate, and a dicarboxylic or polycarboxylic acid such as azelaic acid or pimelic acid. When employed, the aluminum ion is typically present in amounts of about 0.05 to about 5 grams per liter and the di- or poly-carboxylic acid is typically present in amounts of about 1 to about 25 grams per liter.

Another group of stress reducers are alcohols as disclosed in US Patent Publication 2005/0155866 to Gabe, entire disclosure of which is incorporated herein by reference. Typical alcohols include alkyl, alkenyl, alkynyl, aromatic and non-aromatic cyclic alcohols. When employed, the alcohols are typically used in amounts of about 0.001 grams per liter to about 100 grams per liter and more typically about 0.01 grams per liter to about 20 grams per liter.

The electroplating can be carried out using an anode such as Pt or other noble metals, and a cathode, which is the wafer substrate to be plated with a conductive seedlayer. The seed layer as discussed above can be any conductive material. A typical Rh plating chemistry used is from Enthone-EMI, which is composed of three components: the Rhodex 100 containing the main salt with 5 g/l of Rh metal concentration; the Rhodex 100 stress reducer, 10% in volume is used; and 3% $H_2SO_4$ in volume. Other commercially available electroplating bath that can be used according to this disclosure include, but are not limited to, Rhodex bright Rhodium, Technic-Rhodium, and Technic Rhodium S-less.

The electroplating is typically carried out employing a current density of about 1 to about 100 milliamps/$cm^2$, more typically about 1 to about 50 milliamps/$cm^2$ and even more typically about 2 to about 10 milliamps/$cm^2$. Also the electroplating is typically carried out at temperatures of about 10° C. to about 80° C.

The present disclosure finds particular importance when electroplating onto relatively large and resistive substrates or wafers such as wafers of at least 200 mm, more typically about 200 mm to about 500 mm and even more typically about 200 mm to about 300 mm. When electroplating of Rh onto large and resistive substrates (such as 200 mm and 300 mm wafers), to form uniform deposit typically requires a special method and tooling. When the resistance from wafer edge, where the electrical contact is made, to the center of a wafer is substantial enough to cause deposition only to occur on a thin ring of the wafer edge when trying to use a constant current density waveform. A narrow ring was first plated with a small current and then the current ramps up to propagate plating inwards towards the wafer center, and then the current is held at a constant value to plate up the overall thickness.

A wafer "thief" can be utilized to obtain a more uniform deposit by diverting current away from the wafer edge and onto the thief electrode. But the extent of this approach is either limited by the size of the thief and hence the depth of current diverting is limited, or the thief is sufficiently large but then the edge with thinner than center deposit will be so broad that it sacrifices large area on the wafer edge. A diffuser, or ceramic plug, or other resistive structure between the wafer (cathode) and the anode is an element in the tool configuration to make the deposit uniform over a large area eventually. 300 mm wafers were plated on a plating tool with a ceramic plug in between the anode and the cathode. The thickness uniformity of the deposit improves with the increase of resistance of the plug.

Figure 6:
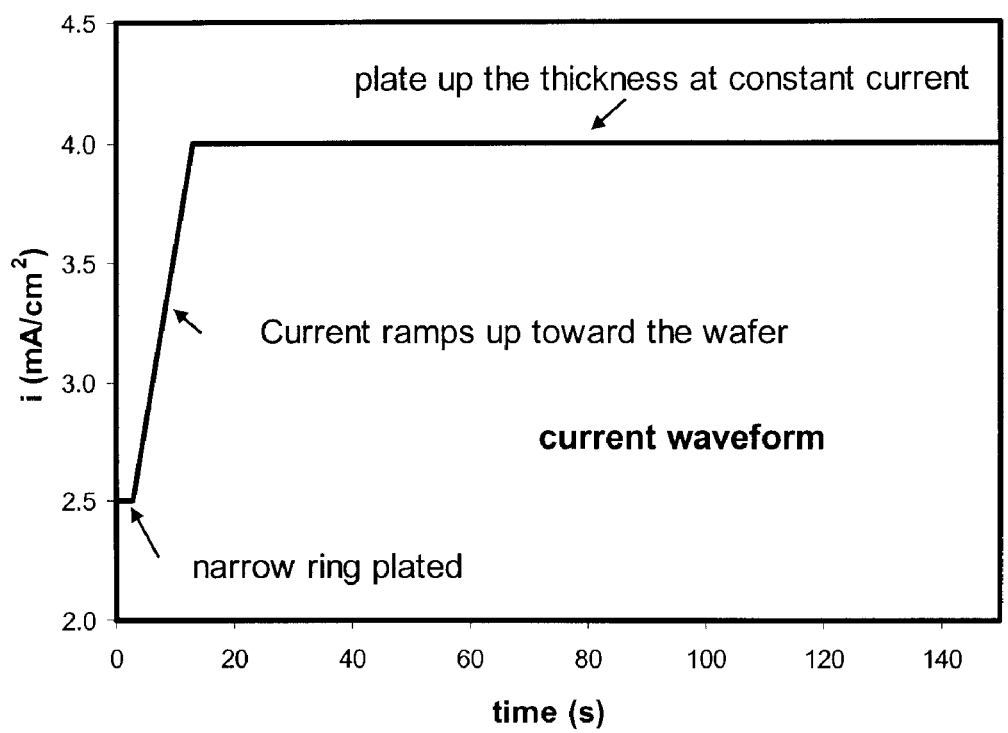
FIG. 6 illustrates current waveform.

A current waveform as shown in FIG. 6 was used to deposit a 300 mm wafer with 60 nm×290 nm via patterns. The vias were superfilled with Rh without any voids or seams from wafer center to wafer edge.

Figure 7:
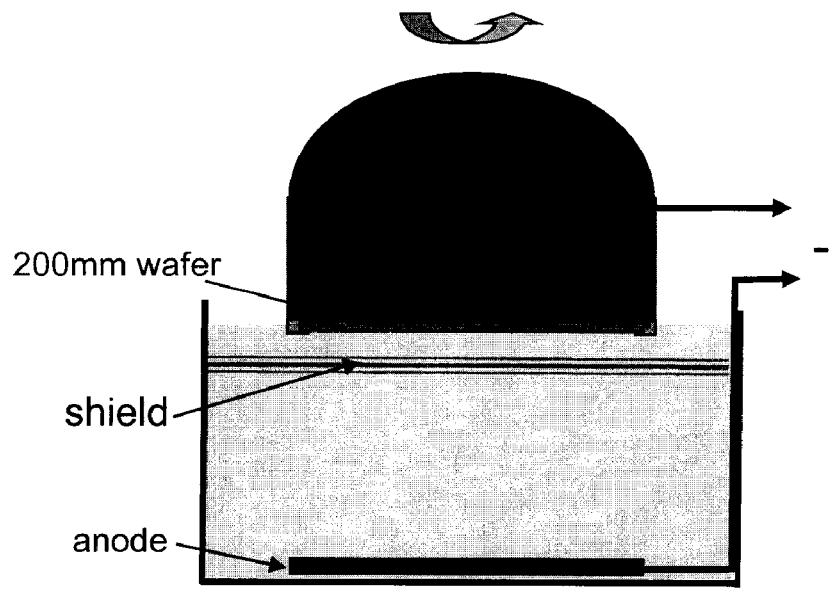
FIG. 7 illustrates a plating setup with a shield between the wafer and anode.
Figure 8:
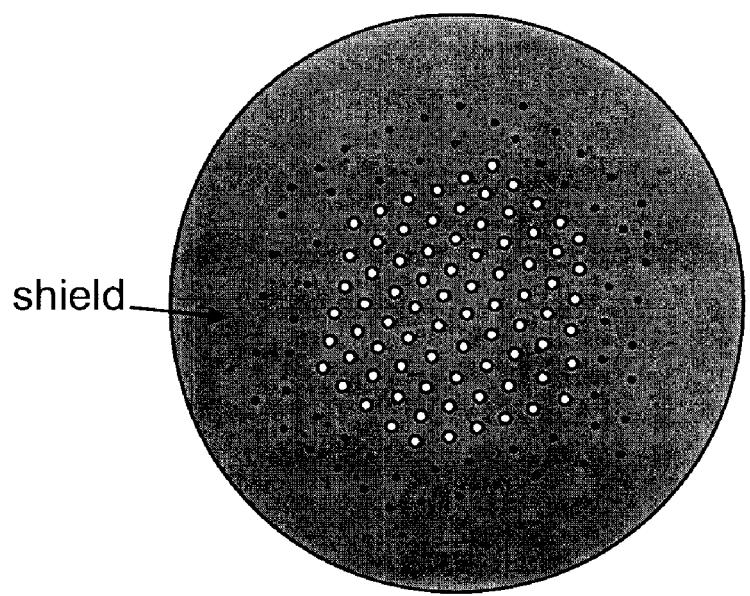
FIG. 8 illustrates the shield used in FIG. 7.

200 mm wafers were deposited with a plating setup to have a diffuser or shield in between the wafer and the anode. The uniformity is controlled by the relative porosity of the shield. FIG. 8 shows one example of the shield porosity to achieve uniform deposit across the wafer. In particular, FIG. 7 shows a 200 mm plating setup with a shield in between the wafer and the anode. The relative porosity of the shield controls the uniformity of the deposit. A current waveform similar to FIG. 6 was used to plate a 200 mm wafer with 225 nm×540 nm via patterns. The vias were superfilled without voids or seams from wafer center to wafer edge.

Figure 9:
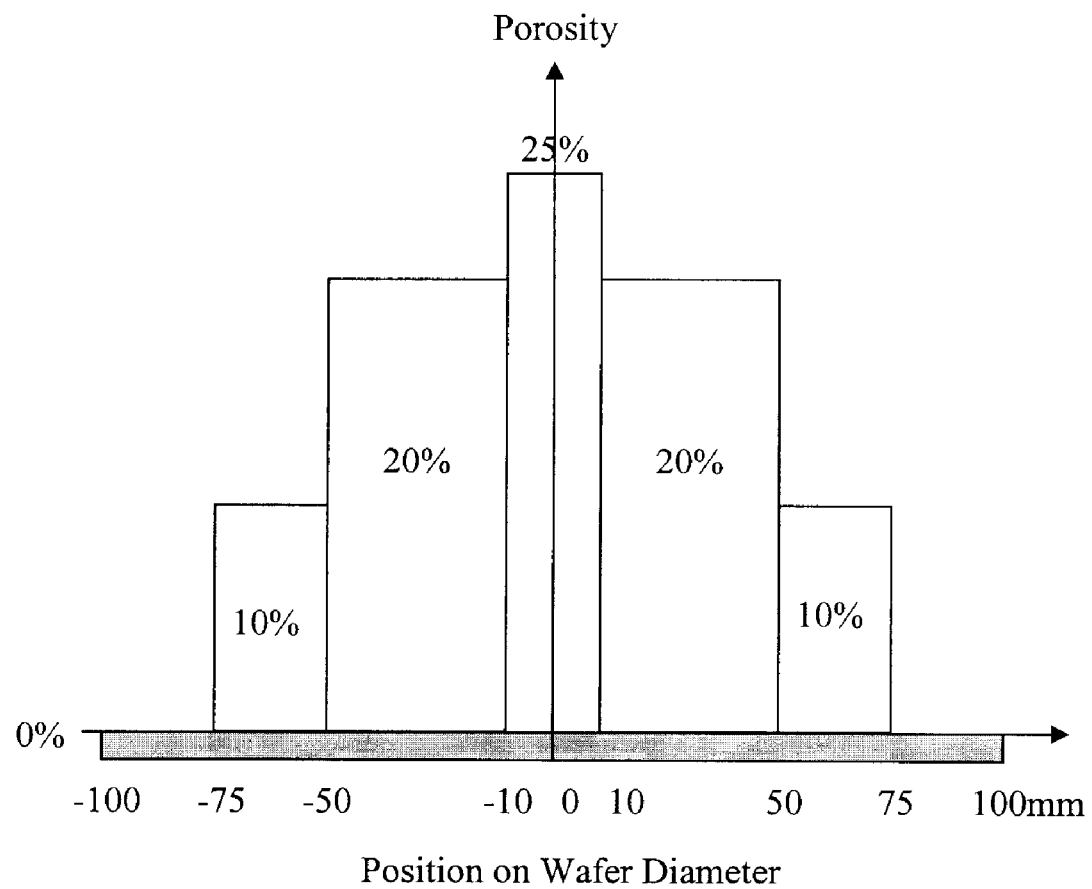
FIG. 9 is an example of porosity on a sample shield.

FIG. 9 illustrates an example of porosity of the shield with a 200 mm wafer. The pore size variation to get the porosity density uses a pore diameter from D=0.01 cm-2.0 cm. The pore distribution density is used to get the porosity density and the same diameter pores but different density to obtain porosity are used.

When plating onto a large substrate, a current waveform is typically used. Typically the initial current density is about 0.1 milliamps/$cm^2$ to about 5 milliamps/$cm^2$ and is typically carried out for about 1 to about 20 seconds and more typically about 1 to about 10 seconds. The current density is then ramped up, typically in about 5 to about 120 seconds and more typically in about 5 to about 60 seconds, an example being about 15 seconds to the higher current density to plate to the desired thickness.

The plating current density is higher than the initial and is typically about 1 to about 100 milliamps/$cm^2$, more typically about 1 to about 50 milliamps/$cm^2$ and even more typically about 2 to about 10 milliamps/$cm^2$. The final current density is typically carried out from about 60 seconds to about 60 minutes to the desired thickness. The ramping of the current density is typically linear.

FIG. 6 illustrates an example of a current waveform used in plating 300 nm wafers with a very thin Ru seed layer (80 Å). The sheet resistance was about 35 ohm/sq.

The process of this disclosure can optionally include a thermal annealing step when it is desired to decrease the resistivity of the rhodium. When employed, the annealing is typically carried out at temperatures above 190° C. and more typically at about 190° C. to about 400° C. The annealing is typically carried out in an air, $O_2$, $N_2$, $H_2$, forming gas, argon or helium atmosphere. Rhodium contacts according to this disclosure typically have a resistivity between 5 micro-ohm-cm to 50 micro-ohm-cm, with the lower values being obtained using the optional annealing step.

The structure can be planarized such as by polishing the plated rhodium seed layer and adhesion layer, if present, in the field area down to the dielectric layer. See FIG. 1C.

The following non-limiting examples are presented to further illustrate the present disclosure.

EXAMPLE 1

A thin film of 500 nm Rh or less was plated onto Ru-seeded substrate with the Rh plating solution at 50° C. at −2.5 mA/$cm^2$ constant current density and an electrode rotation rate of 100 rpm. The film was then measured with a four-point probe for sheet resistance. The resistivity of the film was calculated with the measured sheet resistance and the film thickness to be 44 micro-ohm-cm. The composition of the film was then measured with the SIMS (secondary ion mass spectroscopy) method and found to have a high level of oxygen, chloride, and sulfur impurity within the Rh. The Rh film was then annealed at 400° C. in forming gas for 4 hours. There is significant grain growth observed from x-ray diffraction, and the Rh resistivity dropped significantly to 9 micro-ohm-cm.

EXAMPLE 2

A thin film of Rh was plated onto a Ru-seeded substrate with the Rh plating solution at room temperature (varies between 19-24° C.) at −2.5 mA/$cm^2$ constant current density and an electrode rotation rate of 100 rpm. The film was then measured with a four-point probe for sheet resistance. The resistivity of the film was calculated with the measured sheet resistance and the film thickness to be 19 micro-ohm-cm. The composition of the film was then measured with the SIMS method and found to have a much lower level of oxygen and chloride impurity within the Rh, about 2 orders of magnitude lower in both O, Cl, and S concentrations. The Rh film was then annealed at 400° C. in forming gas for 4 hours. There is significant grain growth observed from x-ray diffraction, and the Rh resistivity dropped significantly to 7 micro-ohm-cm.

See Table 1 for the comparison of the two Rh Examples 1 and 2 plated at different temperatures.

TABLE 1

Resistivity of as-plated and post forming gas annealed Rh films from two different plating conditions with O, Cl, and S impurity level in these two Rh films from SIMS analysis.

| Example | As-plated (µohm-cm) | Post FGA (µohm-cm) | O counts (atom/$cm^3$) | Cl counts (atom/$cm^3$) | S counts (atom/$cm^3$) |
|---|---|---|---|---|---|
| 1-Rh from room temperature plating | 19 | 7 | 4E19 | 4E18 | 1E18 |
| 2-Rh from plating at 50° C. (Enthone recommended temperature) | 44 | 9 | 4.5E21 | 2E21 | 2E20 |

EXAMPLE 3

A structure made of silicide/oxide/ALD TaN/ALD Ru with contact via size of 125 nm×560 nm was plated with Rh. It was plated at room temperature at −2.5 mA/$cm^2$ constant current density and an electrode rotation rate of 100 rpm. The vias are filled with Rh without center voids or center seams.

EXAMPLE 4

Figure 5:
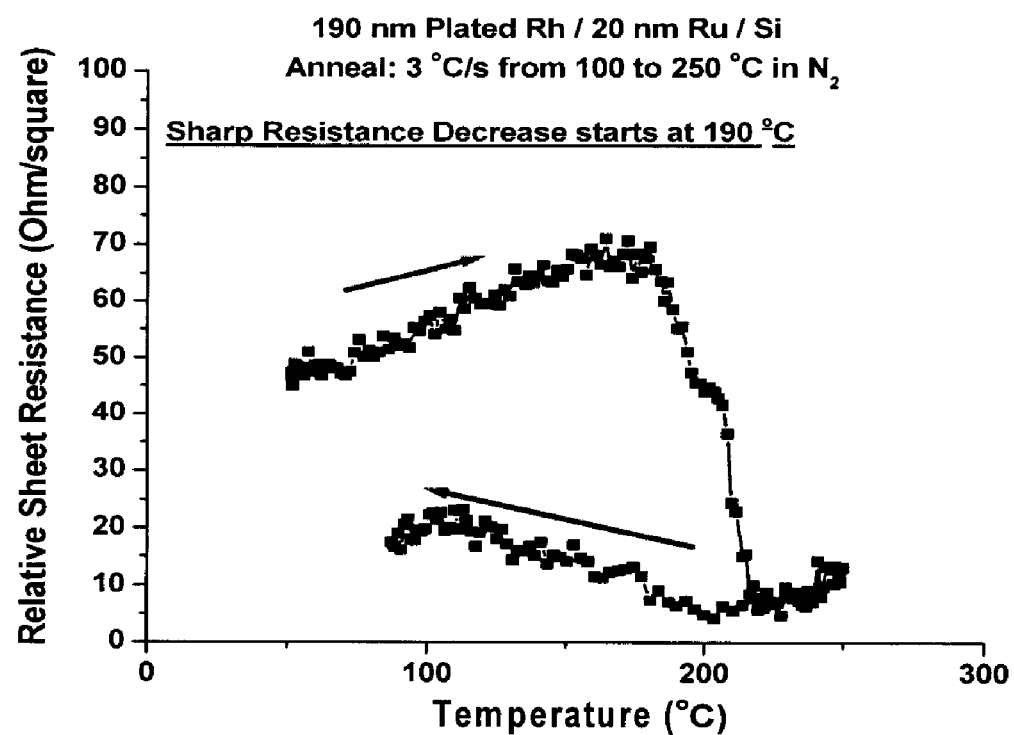
FIG. 5 is a graph illustrating in-situ electroplated sheet resistance of rhodium during temperature ramping.
Figure 10:
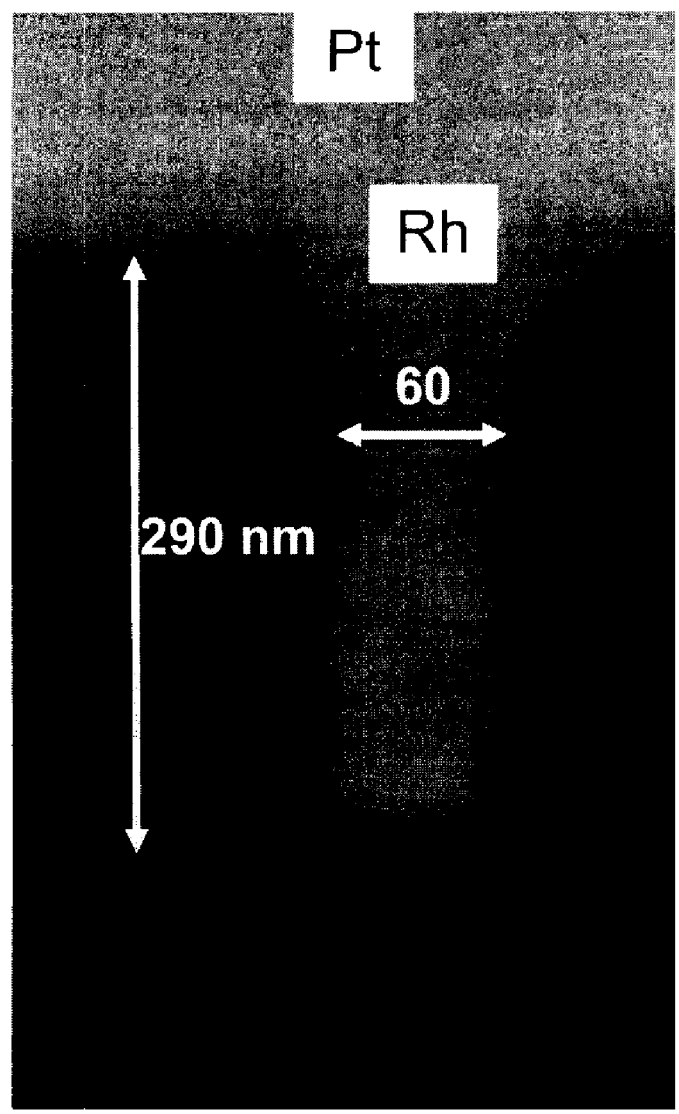
FIG. 10 is a SEM cross section image of vias on a 300 mm wafer filled with electroplated rhodium according to the present disclosure.

Contact vias of 300 mm wafers are filled with Rhodium through electroplating. The structure is made of silicide/USG/ALD TaN/ALD Ru/Rh plating. The via dimension is about 60 nm×290 nm. As can be seen from FIG. 10, the high aspect ratio vias are nicely filled without any voids or center seams. The current waveform shown in FIG. 5 is used.

EXAMPLE 5

A structure made of silicide/nitride/oxide/ALD TaN/ALD Ru with contact via size of 40 nm×230 nm and contact bar size of 40 nm×130 nm×230 nm was plated with Rh. It was plated at room temperature at −2.5 mA/cm$^2$ constant current density and an electrode rotation rate of 100 rpm. The vias and bars are filled with Rh without center voids or center seams. See FIG. 9.

In summary, the superfilling plating process of this disclosure for electroplating Rh into submicron sized structures without any center voids or center seams. The plated film is capable of achieving low resistivity of 7 micro-ohm-cm after anneal. The film from the process condition has much lower impurity concentration and hence a lower resistivity than the typical Rh films plated from the chemical vendor process. The lower impurity and lower resistivity, together with superfilling capability are very important for contact applications.

Figure 4:
FIG. 4 is a SEM cross section of vias filled with electroplated rhodium according to the present disclosure.

FIG. 3 shows the voltammograms of the Rhodium plating solution with different components. It shows that the stress reducer is acting as a suppressor, and the sulfuric acid is accelerating the deposition. FIG. 4 is an TEM image showing the superconformal filling of 40 nm CD×240 nm height vias and bars without voids by electrodeposition of rhodium at room temperature (19 degree-22 degree centigrade). The pattern was created with ebeam lithography, and then covered with a thin layer of ALD TaN as adhesion layer and ALD Ru as plating seed layer. Rhodium was successfully deposited into the patterned vias and bars without voids or seams. A thin film of 190 nm Rh was deposited on top of a blanket silicon wafer with PVD TaN and PVD Ru seed layer. FIG. 5 shows the in situ resistance measurement versus temperature on this film. As can be seen the deposit went through recrystallization process when annealed above 190 degree C. The annealed Rh thin film revealed a resistivity of 7 micro-ohm-cm. Plating at 50 degree centigrade, as recommended by the chemical supplier, also superfills similar structure, but the resistivity of the plated rhodium is much higher than deposited at room temperature. A resistivity of 19 micro-ohm-cm is obtained when annealed the rhodium thin film deposited at 50 degree centigrade.

The term "comprising" (and its grammatical variations) as used herein is used in the inclusive sense of "having" or "including" and not in the exclusive sense of "consisting only of." The terms "a" and "the" as used herein are understood to encompass the plural as well as the singular.

The foregoing description illustrates and describes the present disclosure. Additionally, the disclosure shows and describes only the preferred embodiments of the disclosure, but, as mentioned above, it is to be understood that it is capable of changes or modifications within the scope of the concept as expressed herein, commensurate with the above teachings and/or skill or knowledge of the relevant art. The described hereinabove are further intended to explain best modes known of practicing the invention and to enable others skilled in the art to utilize the disclosure in such, or other embodiments and with the various modifications required by the particular applications or uses disclosed herein. Accordingly, the description is not intended to limit the invention to the form disclosed herein. Also it is intended that the appended claims be construed to include alternative embodiments.

All publications, patents and patent applications cited in this specification are herein incorporated by reference, and for any and all purposes, as if each individual publication, patent or patent application were specifically and individually indicates to be incorporated by reference. In this case of inconsistencies, the present disclosure will prevail.

What is claimed is:

1. A process for fabricating a contact rhodium structure which comprises obtaining a substrate having a dielectric layer thereon, wherein the dielectric layer has cavities therein into which the contact rhodium is to be deposited;
    depositing a seed layer in the cavities and on the top surface of the dielectric layer outside of the cavities; and depositing the rhodium by electroplating from a bath comprising a rhodium salt; an acid and a stress reducer, wherein the stress reducer is at least one member selected from the group consisting of a halide, a complex of rhodium sulfate having bridged bidentate sufphato groups, a sulfamic acid, a sulfonic acid, a combination of an aluminum ion a dicarboxylic or polycarboxylic acid, and an alcohol; and then annealing the structure,
    wherein the electroplating comprises an initial current density of about 0.1 milliamps/cm$^2$ to about 5 milliamps/cm$^2$ for about 1 to about 20 seconds followed by a ramping up of the current density in about 5 to about 120 seconds and a higher current density of about 1 to about 100 milliamps/cm$^2$ for about 60 seconds to about 60 minutes plate to the desired thickness.

2. The process of claim 1 which further includes depositing an adhesion layer between the seed layer and dielectric layer.

3. The process of claim 2 wherein said adhesion layer is at least one member selected from the group consisting of titanium, tantalum, titanium nitride and tantalum nitride.

4. The process of claim 3 wherein the adhesion layer is about 20 angstroms to about 200 angstroms thick.

5. The process of claim 1 wherein the seed layer is at least one member selected from the group consisting of ruthenium, platinum, copper, tungsten, cobalt, sulfide and silicon.

6. The process of claim 1 wherein the seed layer is ruthenium.

7. The process of claim 1 wherein the seed layer is about 0.006 μm to about 0.25 μm thick.

8. The process of claim 1 wherein the cavities have an aspect ratio of about between 2 and about 20.

9. The process of claim 1 wherein the cavities have an aspect ratio of between about 4 and about 10.

10. The process of claim 1 wherein the cavities have a CD dimension down to about 40 nanometers.

11. The process of claim 1 wherein the rhodium salt is at least one member selected from the group consisting of rhodium sulfate, rhodium phosphate and rhodium chloride.

12. The process of claim 1 wherein the rhodium salt is rhodium sulfate.

13. The process of claim 1 wherein the amount of rhodium salt in the bath is about 1 to about 100 grams/liter.

14. The process of claim 1 wherein the amount of rhodium salt in the bath is about 1 to about 10 grams/liters with a specific example being 5 grams/liter.

15. The process of claim 1 wherein the acid is at least one member selected from the group consisting of sulfuric acid, hydrochloric acid and phosphoric acid.

16. The process of claim 1 wherein the acid is sulfuric acid.

17. The process of claim 1 wherein the bath has a pH of about 0.1 to about 3.

18. The process of claim 1 wherein the bath has a pH of about 0.5 to about 1.

19. The process of claim 1 wherein the rhodium has a resistivity between about 5 micro-ohm-cm to about 50 micro-ohm-cm and between about 5 micro-ohm-cm to about 20 micro-ohm-cm when annealed above 190° C.

20. The process of claim 1 wherein the electroplating is carried out at temperatures of about 10° C. to about 80° C.

21. The process of claim 1 wherein the substrate is at least 200 mm.

22. The process of claim 1 wherein a porous shield is present between anode and the substrate being plated.

23. The process of claim 22 wherein the porous shield has a porosity that increases from the edge of the substrate inwards towards the center.

24. The process of claim 1 wherein the structure is annealed at temperatures above 190° C. and in an air, $O_2$, $N_2$, $H_2$, forming gas, argon or helium atmosphere.

25. The process of claim 1 which further comprises planarizing the structure.

26. A structure obtained by the process of claim 1.

27. The structure of claim 26 wherein the cavities have an aspect ratio of at least about 2.

28. A process for fabricating a contact rhodium structure which comprises obtaining a substrate having a dielectric layer thereon, wherein the dielectric layer has cavities therein into which the contact rhodium is to be deposited;
depositing a seed layer in the cavities and on the top surface of the dielectric layer outside of the cavities; and depositing the rhodium by electroplating from a bath comprising a rhodium salt; an acid and a stress reducer, wherein the stress reducer is at least one member selected from the group consisting of a halide, a complex of rhodium sulfate having bridged bidentate sufphato groups, a sulfamic acid, a sulfonic acid, a combination of an aluminum ion a dicarboxylic or polycarboxylic acid, and an alcohol; and then annealing the structure,
wherein the cavities have an aspect ratio of between about 2 and about 20, and
wherein the electroplating comprises an initial current density of about 0.1 milliamps/$cm^2$ to about 5 milliamps/$cm^2$ for about 1 to about 20 seconds followed by a ramping up of the current density in about 5 to about 120 seconds and a higher current density of about 1 to about 100 milliamps/$cm^2$ for about 60 seconds to about 60 minutes plate to the desired thickness.

29. The process of claim 1 wherein the cavities have a CD dimension about 30 to about 240 nanometers.

30. The process of claim 1 wherein the cavities have a CD dimension about 40 to about 100 nanometers.

31. The process of claim 1 wherein the substrate is at least about 200 mm.

32. The process of claim 1 wherein the bath has a pH of about 0.1 to about 3 and wherein the electroplating is carried out at temperatures of about 10° C. to about 80° C.

33. The process of claim 32 wherein the bath has a pH of about 0.5 to about 1.

34. The process of claim 28 wherein the bath has a pH of about 0.1 to about 3 and wherein the electroplating is carried out at temperatures of about 10° C. to about 80° C.

35. The process of claim 34 wherein the bath has a pH of about 0.5 to about 1.

* * * * *